US012568714B2

(12) United States Patent
Shida et al.

(10) Patent No.: US 12,568,714 B2
(45) Date of Patent: Mar. 3, 2026

(54) TRANSPARENT ELECTRODE, PRODUCING METHOD THEREOF, AND ELECTRONIC DEVICE USING TRANSPARENT ELECTRODE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Naomi Shida, Minato (JP); Katsuyuki Naito, Bunkyo (JP); Yutaka Saita, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 18/603,441

(22) Filed: Mar. 13, 2024

(65) Prior Publication Data

US 2024/0222535 A1 Jul. 4, 2024

Related U.S. Application Data

(63) Continuation of application No. PCT/JP2022/026768, filed on Jul. 5, 2022.

(51) Int. Cl.

| | |
|---|---|
| ***H10F 77/20*** | (2025.01) |
| ***H10F 10/00*** | (2025.01) |
| ***H10F 71/00*** | (2025.01) |

(52) U.S. Cl.

CPC ........... *H10F 77/244* (2025.01); *H10F 10/00* (2025.01); *H10F 71/138* (2025.01)

(58) Field of Classification Search

CPC ....... H10F 77/244; H10F 71/138; H10F 10/00
See application file for complete search history.

(56) References Cited

U.S. PATENT DOCUMENTS

| | | | |
|---|---|---|---|
| 7,745,498 | B2 | 6/2010 | Pereira et al. |
| 11,563,129 | B2 | 1/2023 | Naito et al. |

(Continued)

FOREIGN PATENT DOCUMENTS

| | | | |
|---|---|---|---|
| CN | 114334274 | A | 4/2022 |
| JP | 2008-538728 | A | 11/2008 |

(Continued)

OTHER PUBLICATIONS

Lim Supplemental (Year: 2017).*

(Continued)

*Primary Examiner* — Sadie White
(74) *Attorney, Agent, or Firm* — Oblon, McClelland, Maier & Neustadt, L.L.P.

(57) ABSTRACT

Provided are a transparent electrode that can be manufactured at a low temperature, has low sheet resistance, is highly transmissive and lightweight, and allows realization of a flexible solar cell, large-area illumination, and the like, a preparing method of the transparent electrode, and an electronic device using the transparent electrode. A transparent electrode according to an embodiment has a network of silver nanowires. The transparent electrode includes a silver nanowire having a minimum curvature radius r of a curve of 2 μm or less and a bending angle Θ of 90° or more, and a compound having a boiling point of 160° C. or lower and an alkynyl group and a hydroxy group.

14 Claims, 7 Drawing Sheets

(A)

(B)

(56) References Cited

U.S. PATENT DOCUMENTS

| | | | | |
|---|---|---|---|---|
| 2006/0219133 | A1* | 10/2006 | Sakamoto | C09C 1/407 106/31.65 |
| 2010/0178417 | A1* | 7/2010 | Connor | H10K 30/81 977/762 |
| 2014/0004371 | A1* | 1/2014 | Chung | H01B 13/0036 428/549 |
| 2014/0205853 | A1* | 7/2014 | Funakubo | C09D 11/037 428/605 |
| 2016/0035927 | A1* | 2/2016 | Gershon | H10K 85/50 438/74 |
| 2018/0026224 | A1* | 1/2018 | Yoo | H10K 50/81 257/40 |
| 2019/0006061 | A1* | 1/2019 | Son | H01B 5/14 |
| 2020/0362187 | A1 | 11/2020 | Hirotoshi et al. | |
| 2022/0416100 | A1 | 12/2022 | Naito et al. | |
| 2023/0187099 | A1 | 6/2023 | Shida et al. | |

FOREIGN PATENT DOCUMENTS

| | | | |
|---|---|---|---|
| JP | 2013-84571 | A | 5/2013 |
| JP | 2015-37831 | A | 2/2015 |
| JP | 6142870 | B2 | 6/2017 |
| JP | 2017-135379 | A | 8/2017 |
| JP | 2018-169929 | A | 11/2018 |
| WO | WO 2006/113207 | A2 | 10/2006 |
| WO | WO 2013/151142 | A1 | 10/2013 |
| WO | WO 2019/142904 | A1 | 7/2019 |
| WO | WO 2021/048923 | A1 | 3/2021 |
| WO | WO 2022/190336 | A1 | 9/2022 |
| WO | WO 2023/021648 | A1 | 2/2023 |

OTHER PUBLICATIONS

Lim (Year: 2017).*

International Search Report issued Sep. 20, 2022 in PCT/JP2022/026768 filed on Jul. 5, 2022, 2 pages.

Office Action issued in Japanese Patent Application No. 2024-531809 on Oct. 31, 2025, with English translation.

* cited by examiner (A)

(B)

Heat (C)

TRANSPARENT ELECTRODE, PRODUCING METHOD THEREOF, AND ELECTRONIC DEVICE USING TRANSPARENT ELECTRODE

CROSS REFERENCE TO RELATED APPLICATIONS

This application is based upon and claims the benefit of priority from the prior International Patent Application PCT/JP2022/026768, filed on Jul. 5, 2022, the entire contents of which are incorporated herein by reference.

FIELD

Embodiments of the present invention relate to a transparent electrode, a producing method thereof, and an electronic device.

BACKGROUND

In recent years, energy consumption has been increasing, and there is an increasing demand for alternative energy to replace conventional fossil energy as a global warming countermeasure. Attention is focused on solar cells as a source of such alternative energy, and development of solar cells is in progress. Application of solar cells to various applications has been studied, but flexibility and durability of solar cells are particularly important in order to cope with various installation places. The most basic monocrystalline silicon-based solar cell is expensive and difficult to be made flexible, and organic solar cells and organic-inorganic hybrid solar cells that have recently attracted attention have room for improvement in terms of durability.

In addition to such solar cells, photoelectric conversion elements such as an organic EL element and an optical sensor have been studied for the purpose of flexibility and durability improvement. In such an element, an ITO film is usually used as a transparent electrode. The ITO film is usually formed by sputtering or the like. In order to have high conductivity, sputtering at a high temperature or high-temperature annealing after sputtering is required, and application to an organic material is often impossible.

On the other hand, silver nanowires are attracting attention as new transparent electrodes because they can be applied and deposited at low temperatures. However, it is necessary to further improve light transmittance, conductivity, and the like.

DETAILED DESCRIPTION

A transparent electrode according to an embodiment is a transparent electrode having a network of silver nanowires, in which the network has a minimum radius of curvature r of a curve 2 μm or less, the transparent electrode including a silver nanowire with a bending angle Θ of 90° or more.

Another transparent electrode according to the embodiment is a transparent electrode having a network of silver nanowires, the transparent electrode including a compound having a boiling point of 160° C. or lower and an alkynyl group and a hydroxy group.

A method for preparing a transparent electrode according to the embodiment includes (A) preparing a dispersion liquid containing a silver nanowire and a compound having an alkynyl group and a hydroxy group, (B) applying the dispersion liquid onto a substrate, and (C) heating and drying the applied substrate.

Further, an electronic element according to the embodiment includes the transparent electrode, a photoelectric conversion layer, and a counter electrode on a transparent substrate.

Embodiments will now be explained with reference to the accompanying drawings.

Embodiment 1

First, a configuration of a transparent electrode according to a first embodiment will be described with reference to FIGS. 1 and 2. The transparent electrode according to the embodiment has a silver nanowire network. Silver nanowires are generally linear, but the transparent electrode according to embodiments is characterized in that it contains bent silver nanowires. The silver nanowire having curvature exhibits excellent properties different from those of a conventional transparent electrode composed of silver nanowires.

Figure 1:
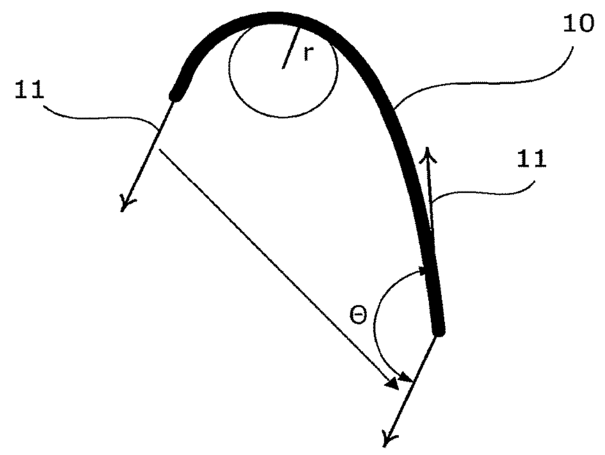
FIG. 1 is a conceptual diagram of a silver nanowire according to an embodiment.
Figure 2:
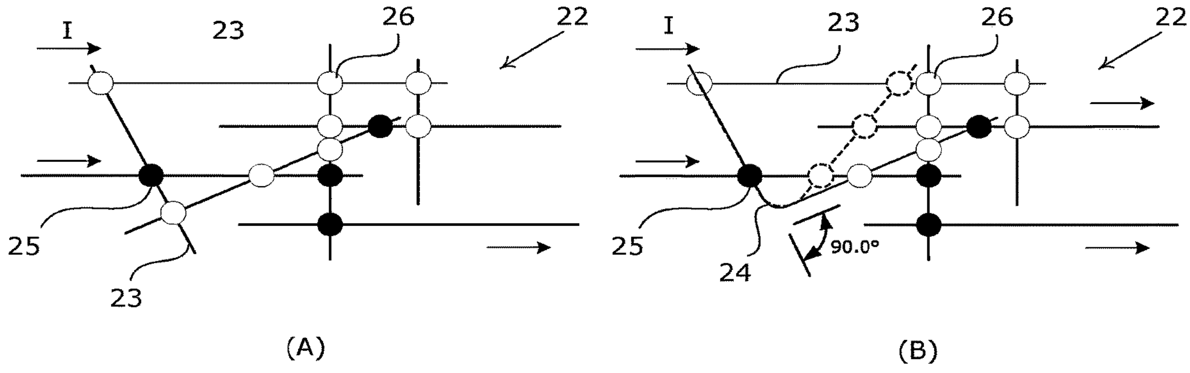
FIG. 2 is a conceptual diagram of a transparent electrode according to a first embodiment.

FIG. 1 is a conceptual diagram illustrating a bending angle and a minimum curvature radius of a silver nanowire 10 according to the present embodiment. In a case where the silver nanowire has a bend, the shape may be a three-dimensional shape, but in embodiments only a two-dimensional shape is considered. That is, in a case where the silver nanowire has a three-dimensional shape, the shape thereof is examined using a projection view seen from one direction.

A bending angle Θ of the silver nanowire is defined as follows. First, a vector 11 of a current at one point on the silver nanowire in a case where a current in a certain direction flows through the silver nanowire 10 is assumed. The vectors 11 are then determined at all points on the silver nanowires. A maximum value of an angle formed by vector directions between two points among all the points is defined as a bending angle Θ. Therefore, the bending angle Θ of the linear silver nanowire without bending is zero. In addition, the bending angle Θ does not exceed 180°.

In addition, as the minimum curvature radius of a silver nanowire, the curvature radius at the point where the rate of change of direction of the vector at respective points is the largest as determined as described above is set as the minimum curvature radius.

FIG. 2(A) is a conceptual diagram of a network 22 including only silver nanowires with very small bending angles. This conceptual diagram illustrates a state in which the current I flows from left to right. Such silver nanowires have, for example, a bending angle Θ of 20° or less. Among the points where the silver nanowires intersect, an intersection where the silver nanowires are in contact with each other and the electrical resistance is small is indicated by a black circle 25, and an intersection where the silver nanowires are not in contact with each other or the electrical resistance is large even if the silver nanowires are in contact with each other is indicated by a white circle 26. In this case, hardly any current flows, and the resistance value of the entire electrode is high.

FIG. 2(B) is a conceptual diagram of the network 22 including silver nanowires 23A having a large bending angle. The network includes many silver nanowires 23 having a small bending angle Θ, but also includes silver nanowires 24 having a bending angle Θ of 90° or more. By having such a structure, the number of intersections where the silver nanowires are in contact with each other and the electrical resistance is small is relatively increased, and the resistance value is lowered.

The minimum curvature radius r and the bending angle Θ are determined by observing the transparent electrode with a scanning electron microscope, randomly selecting three visual fields having a visual field area of 100 $\mu m^2$ or more, and evaluating the visual fields. In order to automatically evaluate, the observation image is binarized to learn and recognize which is a single silver nanowire using AI, and then the bending angle Θ and the minimum curvature radius are determined.

In general, silver nanowires are often linear, and commonly known networks of silver nanowires include many silver nanowires having a small bending angle Θ, for example, the silver nanowires 23 having a bending angle Θ of 20° or less. The electrical resistance of the silver nanowire itself tends to be smaller when the silver nanowire is closer to a linear shape. Therefore, it is preferable to include a large amount of silver nanowires having a small bending angle. Specifically, a content of silver nanowires having a bending angle Θ of 20° or less based on the number of silver nanowires included in the network is preferably 80% or more. However, in the case of a network, as compared with a network including silver nanowires having a large bending angle, in a network including only silver nanowires having a small bending angle, the contact between the silver nanowires tends to decrease, and the electrical resistance as the entire network tends to increase. In contrast to such a network including only silver nanowires having a small bending angle, in the network including the silver nanowires 24 having a minimum curvature radius r of the curve of 2 μm or less and the bending angle Θ of 90° or more according to the present embodiment, the contact between the silver nanowires tends to increase and the electrical resistance tends to decrease. Silver nanowires may intersect but are not necessarily in contact. Since the length of the silver nanowires is finite, it is particularly necessary to increase the number of the contact points between adjacent silver nanowires in order to allow the current to pass from end to end of the network, and for this purpose, a network including silver nanowires having a shape as described above is preferable.

The silver nanowires are typically shorter than 100 μm in length and are difficult to form longer. In a case where a silver nanowire having such a length is assumed, the number of contact points tends to increase when the radius of curvature is 2 μm or less. In addition, when the bending angle Θ is 90° or more, there is an increased chance that a silver nanowire will intersect another similar silver nanowire, and therefore there is a tendency that the number of contact points with low resistance increases. Incidentally, the silver nanowires are bent due to application of stress, but a place where the stress is applied often coincides with a contact point with respect to another silver nanowire, and a large bending angle Θ means that the contact between the silver nanowires at the contact point becomes strong, and the number of contact points also increases, which is considered to indicate that the electrical resistance of the entire network decreases.

Silver nanowires having a large bending angle Θ are preferable because when the bending angle Θ is 120° or more the number, of contact points tends to be yet higher. This is because when the bending angle Θ increases, the number of intersections of the silver nanowires increases as indicated by the broken line in FIG. 2(B).

Note that the contact point tends to increase as the number of silver nanowires having a larger bending angle Θ increases, but specifically, when the content of silver nanowires having a bending angle Θ of 90° or more based on the number of silver nanowires included in the network is 1% or more, the contact point tends to increase. However, in a case of 5% or more, the electrical resistance tends to increase. This is considered to be because the greatly bent silver nanowires themselves have many crystal defects and thus the electrical resistance increases. From such a viewpoint, the content of the silver nanowire having a bending angle Θ of 90° or more is preferably 2 to 4%.

When the average diameter of the silver nanowires is 20 to 50 nm, the silver nanowires tend to be flat and sufficient electrical conductivity can be obtained, which is preferable. If the thickness is smaller than 20 nm, the electrical resistance increases, and the length is insufficient, so that a network is hardly formed. When the thickness is larger than 50 nm, the dispersibility tends to deteriorate as the unevenness increases. The average diameter of the silver nanowires is preferably 30 to 40 nm.

When the average length of the silver nanowires is 5 to 20 μm, a network can be formed to reduce electric resistance, which is preferable. When the average length of the silver nanowires is less than 5 μm, it is difficult to form a network, and the electrical resistance tends to increase, and when the average length of the silver nanowires is more than 20 μm, the dispersibility tends to deteriorate.

When the sheet resistance of the transparent electrode including the network is 10Ω/□ or less, the efficiency of the solar cell, the organic EL element, or the like can be increased. However, when the sheet resistance is too small, the light transmittance tends to decrease. From such a viewpoint, the sheet resistance of the transparent electrode is preferably 6 to 10 Ω/□.

When the transparent electrode contains a conductive inorganic oxide, a conductive organic polymer, or graphene, conductivity can be imparted between the silver nanowires. The overall conductivity is increased and the efficiency can be higher. The conductive inorganic oxide can be arbitrarily selected from those used in the semiconductor field such as ITO, AZO, and $SnO_2$. These can be formed by dry coating such as sputtering or can be formed by wet coating using a nanoparticle dispersion liquid.

As the conductive organic polymer, a polythiophene-based or polypyridine-based conductive polymer is preferable, and a PEDOT-containing polymer is preferable.

In the transparent electrode, a graphene layer can be laminated on the silver nanowire. The graphene layer is preferably one layer or more and four layers or less on average. The graphene is preferably unsubstituted or nitrogen-doped. The nitrogen-doped graphene is preferred for cathodes. The doping amount (N/C atomic ratio) can be measured by an X-ray photoelectron spectrum (XPS), and is preferably 0.1 to 30 atom %, and more preferably 1 to 10 atom %. The graphene film has a high shielding effect and can prevent metal migration.

The transparent electrode preferably contains a compound having an alkynyl group and a hydroxy group. The alkynyl group easily reacts with silver to form acetylide, and the hydroxy group has high dispersibility in water and high adsorptivity due to hydrogen bonding when dried. Due to these effects, this compound has an action of promoting bonding between silver nanowires (details will be described later).

The transparent electrode according to the embodiment may be formed on a substrate. Examples of the material of the substrate include glass, polyethylene terephthalate (PET), polyethylene naphthalate (PEN), polyvinyl chloride (PVC), polycarbonate (PC), polyvinylidene fluoride (PVDF), an epoxy resin, an acrylic resin, and a silicone resin.

Embodiment 2

Figure 3:
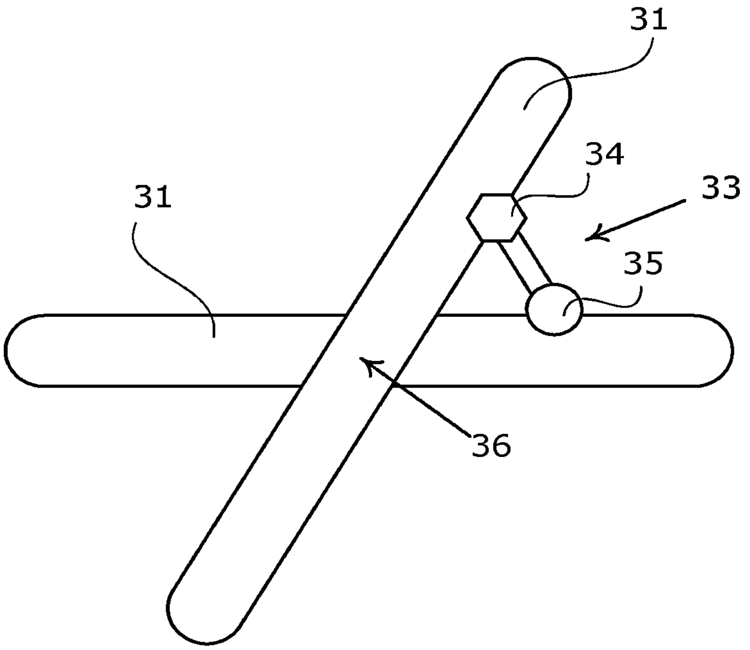
FIG. 3 is a conceptual diagram of a transparent electrode according to a second embodiment.

A configuration of a transparent electrode according to a second embodiment will be described with reference to FIG. 3. FIG. 3 is a conceptual configuration diagram of a transparent electrode 30 according to Embodiment 2.

The transparent electrode 30 has a network 32 including silver nanowires 31. The transparent electrode further has a compound 33 having a boiling point of 160° C. or lower and having an alkynyl group 34 and a hydroxy group 35. A compound having an alkynyl group and a hydroxy group easily reacts with silver due to the alkynyl group to produce acetylide. On the other hand, the hydroxy group has high dispersibility in water and high adsorbability by hydrogen bonding during drying. As a result, the silver nanowires are easily bonded to each other by the compound 33, and the contact point 36 having low resistance is easily generated. When the boiling point is 160° C. or lower, the compound that has not reacted with the silver nanowire in the preparation process can be easily removed by heating. Since the compound 33 which is an organic compound is generally insulating, it is preferable to remove those not involved in the bonding between the silver nanowires.

Such a compound is preferably represented by Formula (1) below:

[Chem. 1]

$$(HC \equiv C)_n - R - (OH)_m$$

(R is a linear or branched hydrocarbon chain having 1 to 6 carbon atoms and may be substituted with a halogen, and n and m are each independently 1 or 2)

Specific examples of the compound represented by Formula (1) include 3,5-dimethyl-1-hexyn-3-ol. Since this compound also has a surfactant action, the coating performance of the silver nanowire dispersion liquid is improved. In addition, since the acetylene hydrogen and the hydroxy group are at the shortest distance, it is easy to bond the silver nanowires to each other.

When the content of the compound represented by Formula (1) in the transparent electrode is 1% by weight or less with respect to the silver nanowire on a mass basis, the bonding property between the silver nanowires is large, and at the same time, the electrical resistance can be reduced.

In the transparent electrode according to Embodiment 2, the silver nanowire is bonded by a compound having an alkynyl group and a hydroxy group, and thus the conductivity is increased. However, in a case where the compound is present during preparation, the bending angle of the silver nanowire is increased in the process of preparing the transparent electrode, and the transparent electrode of Embodiment 1 can be obtained.

Embodiment 3

Figure 4:
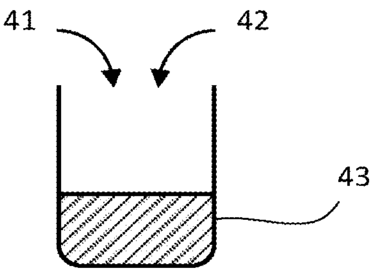
FIG. 4 is a conceptual diagram of a preparing method of the transparent electrode according to the embodiment.
Figure 4:
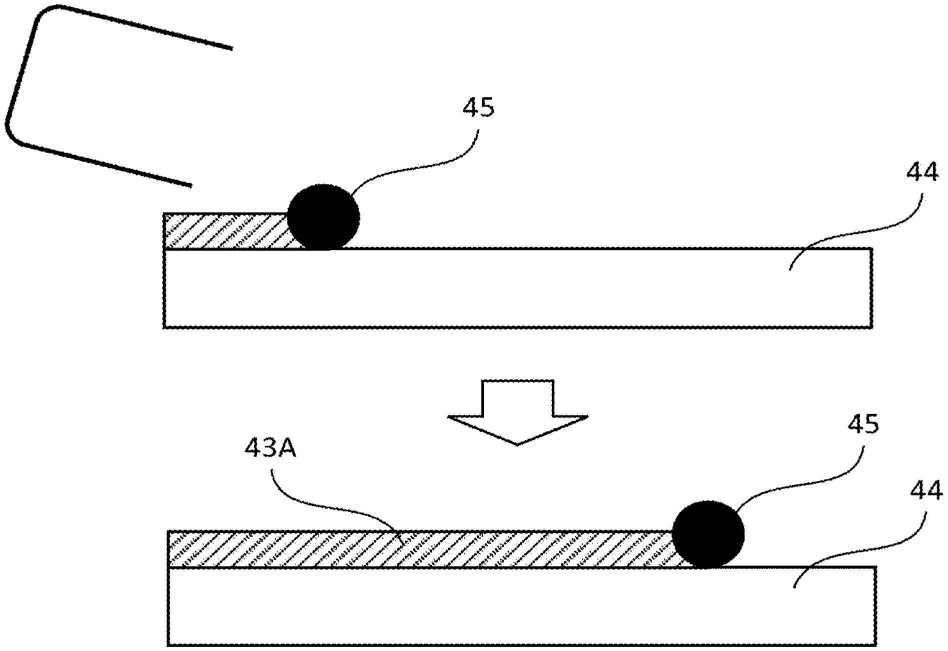
Figure 4:
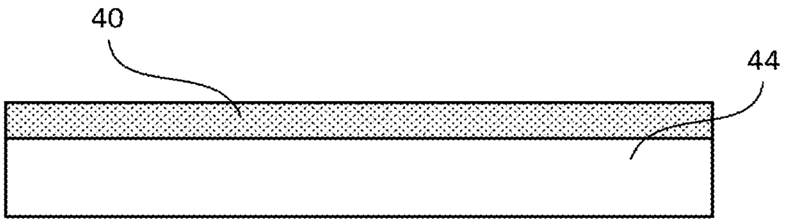

A preparing method of a transparent electrode 40 according to Embodiment 3 will be described with reference to FIG. 4. The method includes (A) producing a dispersion liquid 43 containing a silver nanowire 41 and a compound 42 having an alkynyl group and a hydroxy group, (B) applying the dispersion liquid onto a substrate 44 to produce a precursor film 43A, and (C) producing the transparent electrode 40 by heating and drying a precursor film.

The step (A) is preferably performed immediately before the step (B). This is because the dispersion liquid may be gelled due to stagnation. The dispersion liquid is produced by dispersing the silver nanowire and the compound 42 in a dispersion medium. The boiling point of the dispersion medium is preferably low.

The silver nanowires can be selected and used from any conventionally known silver nanowires, but the average diameter of the silver nanowires is preferably 20 to 50 nm, and the average length is preferably 5 to 20 μm.

The compound 42 is, for example, a compound represented by Formula (1) above. The boiling point of the compound 42 can be 160° C. or lower. As a result, since the drying temperature in the step (C) can be lowered, a substrate having low heat resistance such as a polymer substrate can be used.

In addition, in the dispersion liquid, the total mass of the compound with respect to the total mass of the silver nanowires is preferably equal to or more than the same weight. This improves the dispersibility of the silver nanowires.

The step (B) can be performed by any conventionally known method. Specific examples thereof include spin coating, bar coating, slit coating, roller coating, dip coating, and curtain coating. FIG. 4 illustrates a case where the coating is performed by bar coating using a bar 45.

After the step (B), in the step (C), the excessive dispersion medium and the compound 42 are removed by heating and drying. The heating and drying conditions in the step (C) are adjusted according to the dispersion medium, the compound, and the like to be used. Incidentally, it is preferable that the content of the compound 42 contained in the transparent electrode obtained by heating and drying is 1% by mass or less based on the total mass of the silver nanowires.

According to such a method, since the silver nanowires are bonded to each other by the compound 42 and the bending angle of the silver nanowires is increased, the transparent electrode according to Embodiment 1 can be obtained.

Embodiment 4-1

Figure 5:
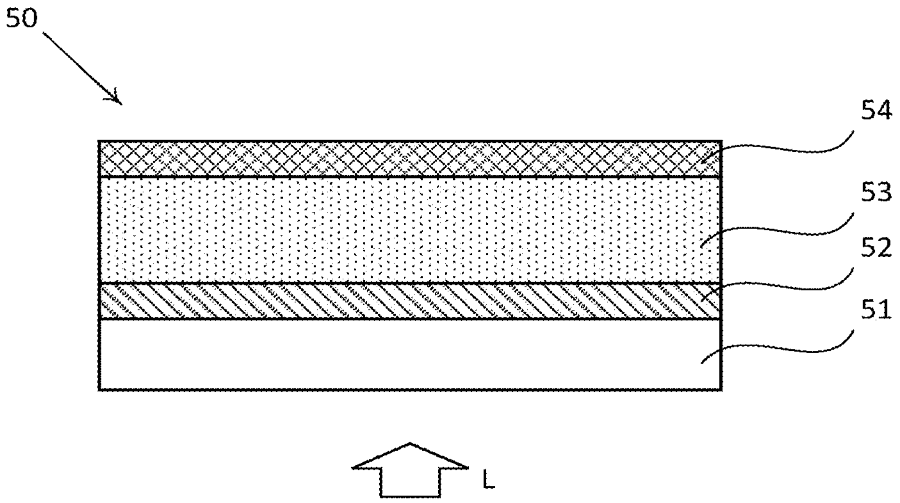
FIG. 5 is a conceptual diagram illustrating a structure of a photoelectric conversion element (solar cell) according to the embodiment.

A configuration of a photoelectric conversion element according to one embodiment of a fourth electronic device will be described with reference to FIG. 5. FIG. 5 is a schematic configuration diagram of a solar cell 50 (photoelectric conversion element) according to the present embodiment. The solar cell 50 is an element having a function as a solar battery that converts light energy such as sunlight L incident on the cell into electric power. The solar cell 50 includes a photoelectric conversion layer 52 provided on a surface of the transparent electrode 51 and a counter electrode 53 provided on a side surface of the photoelectric conversion layer 52 opposite to the transparent electrode 51. Here, the transparent electrode 51 is similar to that shown in Embodiment 1 or 2.

The photoelectric conversion layer 52 is a semiconductor layer for converting light energy of incident light into electric power to generate a current. The photoelectric conversion layer 52 generally includes a p-type semiconductor layer and an n-type semiconductor layer. As the photoelectric conversion layer, a laminate of a p-type polymer and an n-type material, $RNH_3PbX_3$(X may contain a halogen ion, and R may contain an alkali metal ion such as an alkyl group), a silicon semiconductor, an inorganic compound semiconductor (for example, InGaAs, GaAs, chalcopyrite, CdTe, InP, SiGe, $Cu_2O$, and the like), a quantum dot-containing semiconductor, or a dye-sensitized transparent semiconductor may be used. In either case, the efficiency is high, and the degradation of the output can be further reduced.

A buffer layer may be inserted between the photoelectric conversion layer 52 and the transparent electrode 51 in order to promote or block charge injection.

The counter electrode 53 is usually an opaque metal electrode, but the transparent electrode according to the embodiment may be used. Another charge buffer layer or charge transport layer may be inserted between the counter electrode 53 and the photoelectric conversion layer 52.

As an anode buffer layer or a charge transport layer, for example, a layer including PEDOT/PSS, a p-type polymer, 2,2',7,7'-Tetrakis[N,N-di(4-methoxyphenyl)amino]-9,9'-spirobifluorene (hereinafter, referred to as Spiro-OMeTAD), vanadium pentoxide ($V_2O_5$), nickel oxide (NiO), tungsten trioxide ($WO_3$), molybdenum trioxide ($MoO_3$), or the like can be used. The ratio of metal to oxygen in the oxide is not necessarily a stoichiometric ratio.

On the other hand, as a buffer layer or a charge transport layer for a transparent electrode serving as a cathode, a layer including lithium fluoride (LiF), calcium (Ca), 6,6'-phenyl-$C_{61}$-butyl acid methyl ester (hereinafter, referred to as $C_{60}$-PCBM), 6,6'-phenyl-$C_{71}$-butyric acid methyl ester ($C_{70}$-PCBM), Indene-$C_{60}$ bisadduct (ICBA), cesium carbonate ($CS_2CO_3$), titanium dioxide ($TiO_2$), poly [(9,9-bis(3'-(N,N-dimethylamino)propyl)-2,7-fluorene)-alt-2,7-(9,9-dioctyl-fluorene)](PFN), bathocuproine (BCP), zirconium oxide (ZrO), zinc oxide (ZnO), cerium oxide ($CeO_2$), polyethynimine, or the like can be used. The ratio of metal to oxygen in the oxide is not necessarily a stoichiometric ratio.

An electrode having the same structure as that of the transparent electrode 51 may be used as the counter electrode 53. In addition, the counter electrode 53 may contain unsubstituted planar monolayer graphene. The unsubstituted monolayer graphene can be produced by a CVD method using methane, hydrogen, or argon as a reaction gas and a copper foil as a base catalyst layer. For example, after the thermal transfer film and the monolayer graphene are pressure-bonded, copper is dissolved, and the monolayer graphene is transferred onto the thermal transfer film. By repeating the same operation, a plurality of single-layer graphene layers can be laminated on the thermal transfer film, and two to four graphene layers can be produced. A metal wiring for current collection is printed on the film using a silver paste or the like, whereby a counter electrode can be formed. In addition, instead of unsubstituted graphene, graphene in which a part of carbon is substituted with boron may be used. Boron-substituted graphene can be produced in the same manner using $BH_3$, methane, hydrogen, or argon as a reaction gas. These graphene can also be formed on a thermal transfer film and then transferred onto an appropriate substrate such as PET.

These single layer or multilayer graphene may be doped with a tertiary amine as an electron donor molecule. An electrode made of such a graphene film also functions as a transparent electrode.

The solar cell according to the embodiment can have a structure in which both surfaces are sandwiched between transparent electrodes. The solar cell having such a structure can efficiently utilize light from both surfaces. The energy conversion efficiency is generally 5% or more, and is characterized by being stable and flexible for a long period of time.

In addition, as the counter electrode 53, an ITO glass transparent electrode can be used instead of the graphene film. In this case, although flexibility of the solar cell is sacrificed, light energy can be used with high efficiency. Furthermore, as the metal electrode, stainless steel, copper, titanium, nickel, chromium, tungsten, gold, silver, molybdenum, tin, zinc, or the like may be used. In this case, the transparency tends to decrease.

The solar cell can have an ultraviolet cutting layer and a gas barrier layer. Specific examples of an ultraviolet absorber include

- benzophenone-based compound such as 2-hydroxy-4-methoxybenzophenone, 2,2-dihydroxy-4-methoxybenzophenone, 2-hydroxy-4-methoxy-2-carboxybenzophenone, or 2-hydroxy-4-n-octoxybenzophenone;
- benzotriazole-based compounds such as 2-(2-hydroxy-3,5-di-tert-butylphenyl) benzotriazole, 2-(2-hydroxy-5-methylphenyl)benzotriazole, and 2-(2-hydroxy-5-tert-octylphenyl)benzotriazole; or
- salicylic acid ester-based compounds such as phenyl salicylate and p-octylphenyl salicylate. It is desirable to cut ultraviolet rays of 400 nm or less.

As the gas barrier layer, a gas barrier layer that blocks water vapor and oxygen is particularly preferable, and a gas barrier layer that does not easily pass water vapor is particularly preferable. For example, a layer made of an inorganic substance of $Si_3N_4$, $SiO_2$, SiC, $SiO_xN_y$, $TiO_2$, or $Al_2O_3$, ultra-thin glass, or the like can be suitably used. The thickness of the gas barrier layer is not particularly limited, but is preferably in the range of 0.01 to 3000 μm, and more preferably in the range of 0.1 to 100 μm. When the thickness is less than 0.01 μm, sufficient gas barrier properties tend not to be obtained, and on the other hand, when the thickness is more than 3000 μm, characteristics such as flexibility and bendability tend to disappear due to an increase in thickness. The water vapor transmission amount (moisture permeability) of the gas barrier layer is preferably 100 $g/m^2 \cdot d$ to $10^{-6}$ $g/m^2 \cdot d$, more preferably 10 $g/m^2 \cdot d$ to $10^{-5}$ $g/m^2 \cdot d$, and still more preferably 1 $g/m^2 \cdot d$ to $10^{-4}$ $g/m^2 \cdot d$. The moisture permeability can be measured in accordance with JIS Z0208 or the like. A dry method is suitable for forming the gas barrier layer. Examples of the method for forming the gas barrier layer having a gas barrier property by a dry method include a vacuum vapor deposition method such as resistance heating vapor deposition, electron beam vapor deposition, induction heating vapor deposition, and an assist method using plasma or ion beam, a sputtering method such as a reactive sputtering method, an ion beam sputtering method, or an electron cyclotron (ECR) sputtering method, a physical vapor deposition method (PVD method) such as an ion plating method, and a chemical vapor deposition method (CVD method) using heat, light, plasma, or the like. Among them, the vacuum vapor deposition method in which a film is formed by a vapor deposition method under vacuum is preferable.

In a case where the transparent electrode according to the embodiment includes a substrate, the type of the substrate is selected according to the purpose. For example, as the transparent substrate, an inorganic material such as glass, or an organic material such as PET, PEN, polycarbonate, PMMA, polyvinyl chloride, or PVDF is used. In particular, use of a flexible organic material is preferable because the transparent electrode according to the embodiment is rich in flexibility.

The solar cell of the present embodiment can also be used as a photosensor.

Embodiment 4-2

Figure 6:
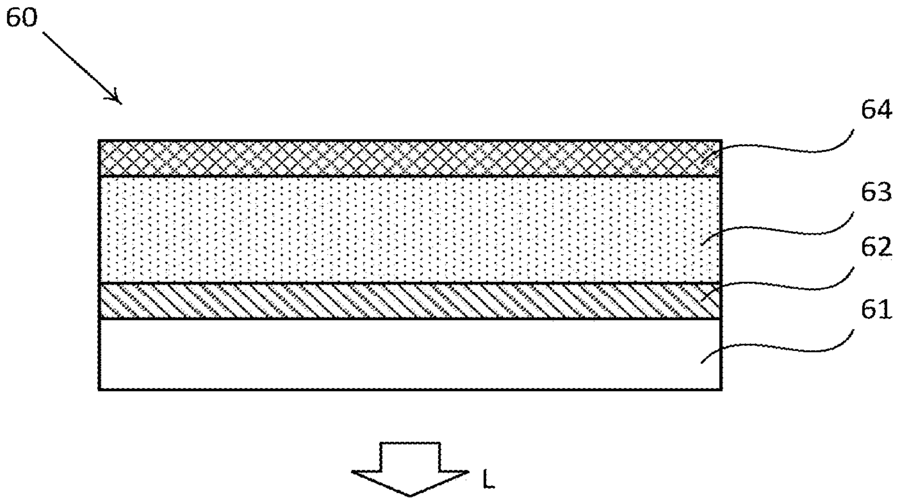
FIG. 6 is a conceptual diagram illustrating a structure of a photoelectric conversion element (organic EL element) according to the embodiment.

A configuration of a photoelectric conversion element according to another fourth embodiment will be described with reference to FIG. 6. FIG. 6 is a schematic configuration diagram of an organic EL element 60 (photoelectric conversion element) according to the present embodiment. The organic EL element 60 is an element having a function as a light emitting element that converts electric energy input to the element into light L. The organic EL element 60 includes a photoelectric conversion layer (light emitting layer) 62 provided on a surface of the transparent electrode 41, and a counter electrode 63 provided on a side surface of the photoelectric conversion layer 62 opposite to the transparent electrode 61.

Here, the transparent electrode 61 is the same as that shown in Embodiment 1 or 2. The photoelectric conversion layer 62 is an organic thin film layer that recombines the charge injected from the transparent electrode 61 and the charge injected from the counter electrode 63 to convert electric energy into light. The photoelectric conversion layer 62 is usually composed of a p-type semiconductor layer and an n-type semiconductor layer. A buffer layer may be provided between the photoelectric conversion layer 62 and the counter electrode 63 to promote or block charge injection, and another buffer layer may also be provided between the photoelectric conversion layer 62 and the transparent electrode 51. The counter electrode 63 is usually a metal electrode, but a transparent electrode may be used.

EXAMPLES

Example 1

Figure 7:
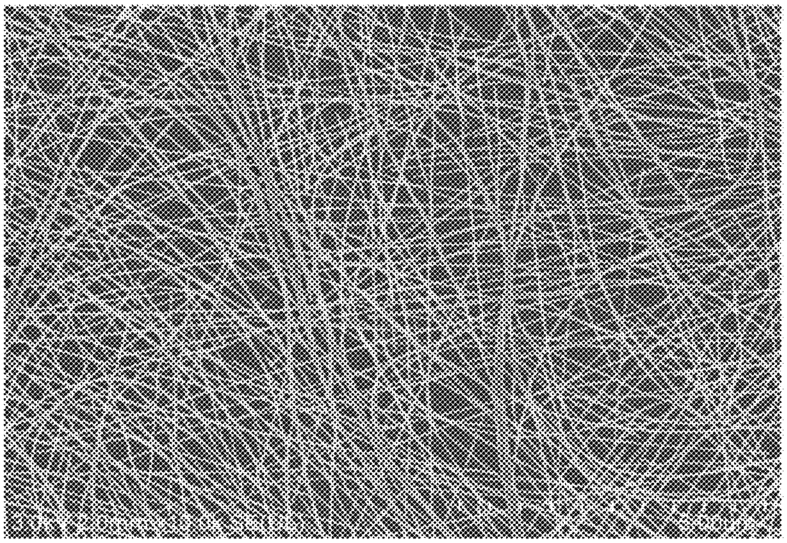
FIG. 7 is a surface SEM photograph of a transparent electrode of Example 1.

A transparent electrode having a structure in which a surface SEM is illustrated in FIG. 7 is produced. An aqueous dispersion liquid containing 0.3 wt % of silver nanowires having an average diameter of 30 nm and an average length of 5 μm and 0.35 wt % of 3,5-dimethyl-1-hexyn-3-ol is applied onto a PET film having a thickness of 125 μm, and then heated and dried at 120° C. to produce a silver nanowire layer. The obtained film had a sheet resistance of 6Ω.

Figure 8:
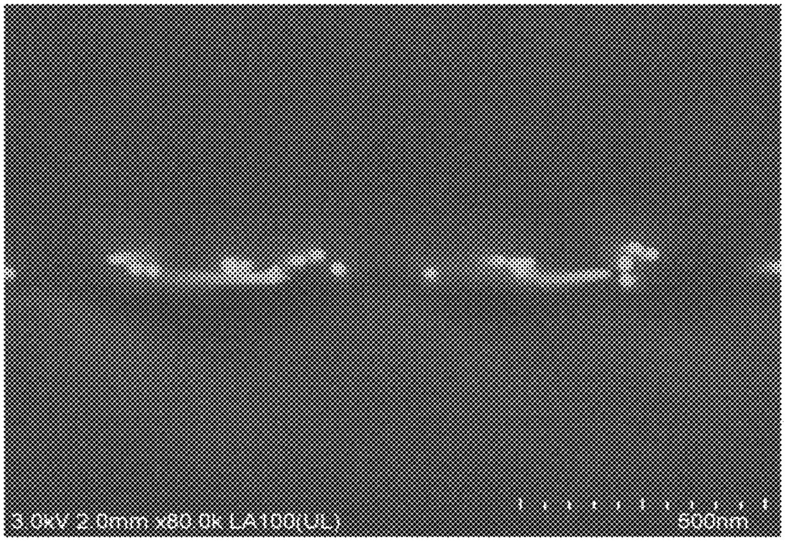
FIG. 8 is a cross-sectional SEM photograph of a transparent electrode of Example 1.

In this transparent electrode, the content based on the number of silver nanowires having a bending angle of 20° or less is 92%, the minimum curvature radius r is 2 μm or less, and the content based on the number of silver nanowires having a bending angle Θ of 90° or more is 1.9% (the total number of measured nanowires is 465). FIG. 8 illustrates a cross-sectional SEM. It can be confirmed that the silver nanowires are close to each other.

The transparent electrode is heated at 150° C. for 10 minutes, and the resulting gas is collected, separated by ion chromatography, and analyzed by mass spectrum to detect a small amount of 3,5-dimethyl-1-hexyn-3-ol.

Comparative Example 1

Figure 9:
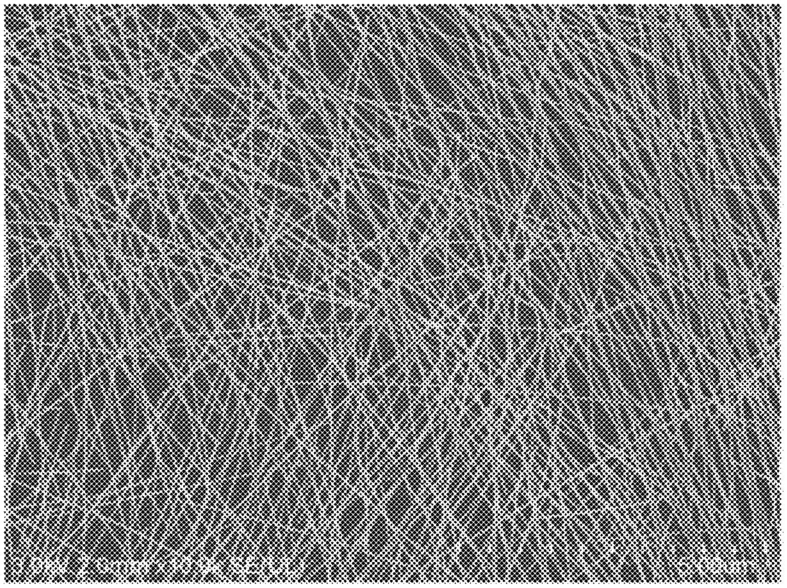
FIG. 9 is a surface SEM photograph of a transparent electrode of Comparative Example 1.
Figure 10:
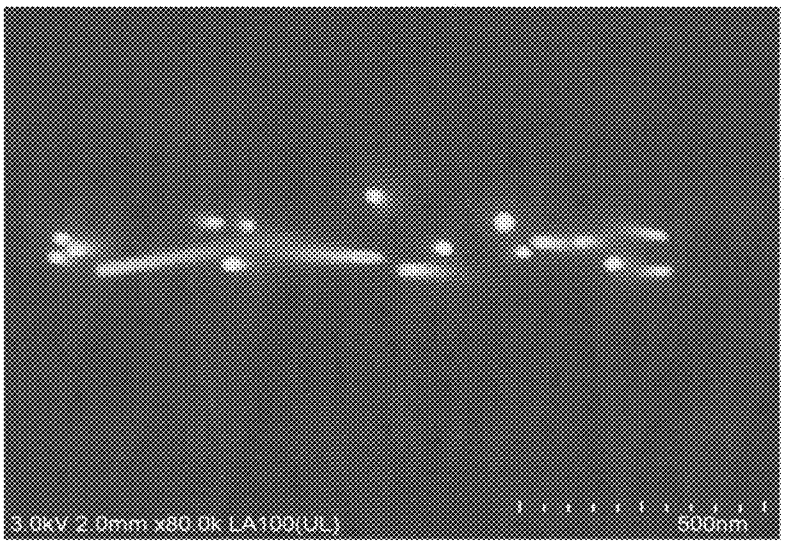
FIG. 10 is a cross-sectional SEM photograph of a transparent electrode of Comparative Example 1.

A transparent electrode is prepared in the same manner as in Example 1 except that 3,5-dimethyl-1-hexyn-3-ol is not added. FIG. 9 illustrates a surface SEM. Most of the silver nanowires have a bending angle of 20° or less, and no silver nanowire has the minimum curvature radius r of 2 μm or less and the bending angle Θ of 90° or more. The transparent electrode has a sheet resistance of 9Ω, which is larger than that of Example 1. FIG. 10 illustrates a cross-sectional SEM. It can be confirmed that the silver nanowires are separated from each other as compared with Example 1.

Example 2

An aqueous dispersion liquid containing 0.2 wt % of silver nanowires having an average diameter of 30 nm and an average length of 5 μm and 0.25 wt % of 3,5-dimethyl-1-hexyn-3-ol is applied onto a PET film having a thickness of 125 μm with a meniscus, and then dried by heating at 120° C. to produce a silver nanowire layer. The obtained film had a sheet resistance of 13Ω.

In this transparent electrode, the content based on the number of silver nanowires having a bending angle of 20° or less is 84%, the minimum curvature radius r is 2 μm or less, and the content based on the number of silver nanowires having a bending angle Θ of 90° or more is 2.3%.

Example 3

An aqueous dispersion liquid containing 0.3 wt % of silver nanowires having an average diameter of 30 nm and an average length of 5 μm and 0.3 wt % of 3,5-dimethyl-1-hexyn-3-ol is applied onto a PET film having a thickness of 125 μm with a meniscus, and then dried by heating at 120° C. to produce a silver nanowire layer. The obtained film had a sheet resistance of 13Ω.

In this transparent electrode, the content based on the number of silver nanowires having a bending angle of 20° or less is 89%, the minimum curvature radius r is 2 μm or less, and the content based on the number of silver nanowires having a bending angle Θ of 90° or more is 1.4%.

Example 4

Figure 11:
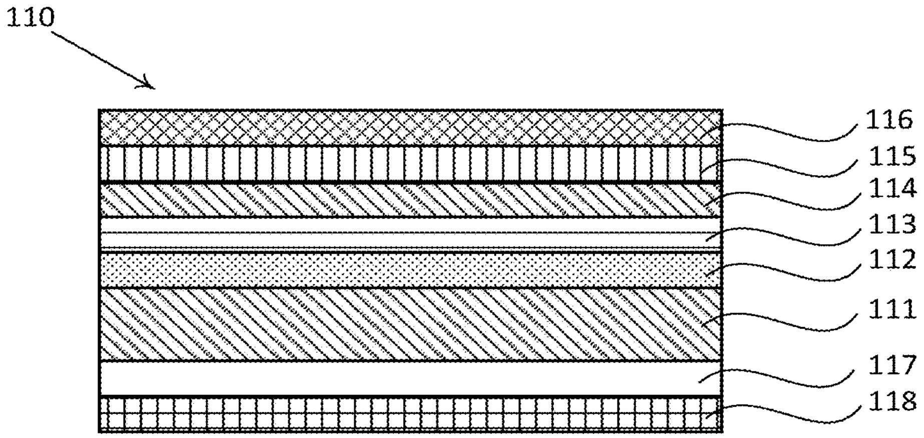
FIG. 11 is a conceptual diagram illustrating a structure of a photoelectric conversion element (solar cell) of Example 3.

A solar cell 110 illustrated in FIG. 11 is produced.

An aqueous dispersion liquid of neutral PEDOT at pH 6.0 (Clevios P Jet) is applied onto the transparent electrode 111 obtained in Example 1 with a meniscus and heated to prepare a PEDOT layer 112.

A chlorobenzene solution containing poly (3-hexylthiophene-2,5-diyl) and $C_{60}$-PCBM is applied with a meniscus and dried at 100° C. for 20 minutes to produce the photoelectric conversion layer 113. Next, a toluene solution of $C_{60}$-PCBM is applied with a meniscus and dried to produce an electron transport layer 114. Next, an aqueous solution of lithium fluoride is applied as an electron injection layer 115. Aluminum is vapor-deposited thereon to produce the counter electrode 116.

An ultraviolet cutting ink containing 2-hydroxy-4-methoxybenzophenone is screen-printed on the surface of the transparent substrate to produce an ultraviolet cutting layer 117. A silica film is formed on the ultraviolet cutting layer by a vacuum vapor deposition method to produce a gas barrier layer 118, and the whole is sealed with a film to produce a solar cell 110.

The obtained solar cell exhibits an energy conversion efficiency of 5% or more for 1 SUN of sunlight.

Example 5

Figure 12:
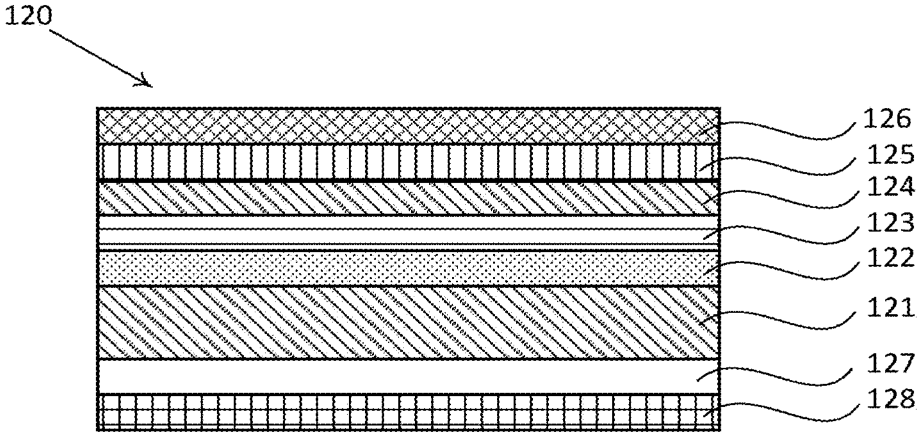
FIG. 12 is a conceptual diagram illustrating a structure of a photoelectric conversion element (solar cell) of Example 4.

A solar cell 120 illustrated in FIG. 12 is produced.

An AZO nanoparticle dispersion liquid is applied onto the transparent electrode 121 obtained in Example 1 and heated to produce an AZO layer 122. An isopropanol solution of tetraisopropoxytitanium is applied thereon and heated to produce an electron injection layer 123 including a TiOx layer. TiOx may deviate from the chemical equivalent and may include an alkyl group. Next, an isopropanol solution of $PbI_2$ is applied. Next, an isopropanol solution of methylammonium iodide is applied. The photoelectric conversion layer 124 is produced by drying at 100° C. for 10 minutes. Next, a toluene solution of Spiro-OMeTAD is applied and heated to produce a hole transport layer 125. An ITO film is sputtered thereon to produce the counter electrode 126.

An ultraviolet cutting ink containing 2-hydroxy-4-methoxybenzophenone is screen-printed on the surface of the transparent substrate to produce an ultraviolet cutting layer 127. A silica film is formed on the ultraviolet cutting layer by a vacuum vapor deposition method to produce a gas barrier layer 128, and a translucent solar cell 120 is produced.

The obtained solar cell exhibits an energy conversion efficiency of 10% or more for 1 SUN of sunlight.

Example 6

An organic EL element is prepared. An AZO nanoparticle dispersion liquid is applied onto the transparent electrode obtained in Example 1 and heated to produce an AZO layer. An aqueous solution of lithium fluoride is applied as an electron injection layer, and tris (8-hydroxyquinoline) aluminum ($Alq_3$) (40 nm) which also functions as an n-type semiconductor and is a light emitting layer is vapor-deposited to prepare a photoelectric conversion layer. N,N'-Di-1-naphthyl-N,N'-diphenyl-1,1'-biphenyl-4,4'-diamine (NPD) is vapor-deposited thereon in a thickness of 30 nm to prepare a hole transport layer. A gold electrode is formed thereon by a sputtering method. Further, the periphery is sealed to produce an organic EL element. The obtained organic EL element has an efficiency of 20% or more.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

REFERENCE SIGNS LIST

10 Silver Nanowire
11 Current
21 Transparent substrate
22 Network
23 Silver nanowire having bending angle Θ of 20° or less
24 Silver nanowire having minimum curvature radius r of curve of 2 μm or less and bending angle Θ of 90° or more
25 Small electrical resistance intersection
26 High electrical resistance intersection
30 Transparent electrode
31 Silver Nanowire
32 Network
33 Compound
34 Alkynyl group
35 Hydroxy group
40 Transparent electrode
41 Silver Nanowire
42 Compound
43 Dispersion liquid
43A Precursor film
44 Substrate
45 Bar
40 Organic EL element
41 Transparent electrode
42 Photoelectric conversion layer
43 Counter electrode
50 Solar cell
51 Transparent electrode
52 Photoelectric conversion layer
53 Counter electrode
60 Organic EL element
61 Transparent electrode
62 Photoelectric conversion layer
63 Counter electrode
64 Electron injection layer
65 Counter electrode
110 Solar cell
111 Transparent electrode
112 PEDOT layer
113 Photoelectric conversion layer
114 Electron transport layer
115 Electron injection layer
116 Counter electrode
117 Ultraviolet cutting layer
118 Gas barrier layer
120 Solar cell
121 Transparent electrode
122 AZO layer
123 Electron injection layer
124 Photoelectric conversion layer
125 Hole transport layer
126 Counter electrode
127 Ultraviolet cutting layer
128 Gas barrier layer

The invention claimed is:

1. A transparent electrode having comprising:

a network of silver nanowires, wherein said network comprises a bent silver nanowire with a minimum radius of curvature r of a curve of 2 μm or less, and with a bending angle Θ of 90° or more, wherein a content of bent silver nanowires having a bending angle Θ of 20° or less based on the number of silver nanowires included in said network is 80% or more, and wherein a content of bent silver nanowires having a bending angle Θ of 90° or more is 2 to 4% based on the number of silver nanowires included in said network.

2. The transparent electrode according to claim 1, comprising a bent silver nanowire having a bending angle Θ of 120° or more.

3. The transparent electrode according to claim 1, wherein an average diameter of said bent silver nanowires included in said network is 20 to 50 nm.

4. The transparent electrode according to claim 1, wherein an average length of said bent silver nanowires included in said network is 5 to 20 μm.

5. The transparent electrode according to claim 1, wherein a sheet resistance of said transparent electrode is 10Ω/□ or less.

6. The transparent electrode according to claim 1, further comprising: a conductive inorganic oxide; a conductive organic polymer; or graphene.

7. The transparent electrode according to claim 1, wherein said transparent electrode contains a compound having an alkynyl group and a hydroxy group.

8. The transparent electrode according to claim 1, further comprising: a compound having a boiling point of 160° C. or lower and an alkynyl group and a hydroxy group.

9. The transparent electrode according to claim 8, wherein said compound is 3,5-dimethyl-1-hexyn-3-ol.

10. The transparent electrode according to claim 8, wherein a content of said compound is 1% by mass or less based on a total mass of silver nanowires included in said network.

11. The transparent electrode according to claim 8, further comprising: a conductive inorganic oxide; a conductive organic polymer; or graphene.

12. An electronic device comprising: the transparent electrode according to claim 1; a photoelectric conversion layer; and a counter electrode on a transparent substrate.

13. The electronic device according to claim 12, wherein said counter electrode is transparent.

14. The electronic device according to claim 12, wherein said photoelectric conversion layer contains halogen ions.

* * * * *